United States Patent
Yamauchi et al.

(10) Patent No.: US 6,255,863 B1
(45) Date of Patent: Jul. 3, 2001

(54) CIRCUIT AND METHOD FOR DETERMINING LEVEL OF DIFFERENTIAL SIGNAL

(75) Inventors: Hiroyuki Yamauchi; Yutaka Terada, both of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/573,827

(22) Filed: May 18, 2000

(30) Foreign Application Priority Data

May 20, 1999 (JP) .................................................. 11-139811

(51) Int. Cl.[7] .................................................. H03K 5/22
(52) U.S. Cl. .............................................. 327/65; 327/362
(58) Field of Search .................................. 327/65, 66, 77, 327/94, 96, 362

(56) References Cited

U.S. PATENT DOCUMENTS 5,898,323 * 4/1999 Suda ......................................... 327/66

* cited by examiner

Primary Examiner—Toan Tran
Assistant Examiner—Linh Nguyen
(74) Attorney, Agent, or Firm—McDermott, Will & Emery

(57) ABSTRACT

The level of a differential signal is determined such that a system, utilizing the level determined, can operate stably enough even if the intermediate potential of the signal changes. A comparator receives, as differential input, a differential signal to be transmitted. During a level determination interval, a sampler/level determiner samples the output of the comparator a number of times, and outputs a most frequently sampled value as the level of the differential signal.

15 Claims, 17 Drawing Sheets potential difference of differential signal

CIRCUIT AND METHOD FOR DETERMINING LEVEL OF DIFFERENTIAL SIGNAL

BACKGROUND OF THE INVENTION

The present invention generally relates to a technique of determining the level of a differential signal in the field of data communications.

In a communications network, an offsetting comparator is used in tristate level determination of a differential signal, i.e., which of the three conditions of "0", "1" and "Z" the signal assumes, to see if the potential difference of the differential signal has exceeded an offset voltage.

FIG. 16 illustrates a tristate level determination of a differential signal in compliance with the IEEE 1394 standard. As illustrated in FIG. 16, the level of the differential signal is determined as "1" when the potential difference thereof is greater than 165 mV; "0" when the difference is less than −165 mV; and "Z" when the difference is between −165 mV and 165 mV, both inclusive. Such a tristate level determination can be performed by connecting together a pair of comparators with an offset voltage of 165 mV and applying a voltage represented by the differential signal to the inverting input terminal of one of these comparators and to the non-inverting input terminal of the other.

Differential transmission lines are often implemented as a twisted pair of signal lines inside a cable. Thus, when the cable is as long as several meters, the signal lines as the transmission lines might be different in length by as much as several tens centimeters. It is rather probable that the signal lines as the transmission lines are slightly different from each other in capacitance, resistance or impedance depending on the layout of the cable, for example.

Accordingly, if the signal potentials of the differential transmission lines have changed steeply, then the relative potential level standings of the differential signal are sometimes reversed instantaneously.

For example, the signal potentials of differential transmission lines change steeply when the intermediate potential of a differential signal, i.e., a potential level of a common voltage, is used as speed signaling information between two communicating nodes in compliance with the IEEE 1394 standard. Speed is shifted among the three frequencies of 100, 200 and 400 Mbps, for example, depending on the level of the common potential. Thus, when data is transmitted or received, the potential level may change sharply.

FIGS. 17(a) through 17(c) illustrate variations in potential of respective signal lines where the in-phase potentials of differential transmission lines TX and XTX steeply drop at a high speed, e.g., from 2.5 V to 0.5 V in less than 1 ns. FIG. 17(a) illustrates a situation where the transmission lines TX and XTX are of an equal length. FIG. 17(b) illustrates a situation where the transmission line TX is shorter than the transmission line XTX. And FIG. 17(c) illustrates a situation where the transmission line TX is longer than the transmission line XTX.

As shown in FIG. 17(a), where the transmission lines TX and XTX are of an equal length, the potential difference of about 100 to 200 mV is kept as it is even if the potentials have changed steeply. However, if the transmission line TX is shorter than the transmission line XTX, then the signal level standings of these transmission lines TX and XTX are reversed instantaneously while the potentials are dropping as shown in FIG. 17(b). Similarly, if the transmission line TX is longer than the transmission line XTX, the signal level standings of these transmission lines TX and XTX are also reversed instantaneously while the dropped potentials on these lines TX and XTX are rising to their original levels as shown in FIG. 17(c).

A system may have its specifications defined on the supposition that a differential signal keeps its potential difference while the potentials are changed. A logic section of such a system is sometimes so constructed as to sample the output signal of a comparator, which receives the differential signal, as it is responsive to a system clock signal, thereby controlling a state machine. A system with that construction cannot operate stably enough if the potential level standings are reversed as shown in FIGS. 17(b) and 17(c).

SUMMARY OF THE INVENTION

It is therefore an object of the present invention to ensure a stabilized operation for a system that utilizes a determined level of a differential signal even if the intermediate potential of the differential signal changes.

Specifically, an inventive circuit for determining a level of a differential signal includes: a level-determining section, which includes a comparator section receiving the differential signal as input and determines the level of the differential signal by an output of the comparator section; and an intermediate potential monitoring section for sending an information signal, which informs that an intermediate potential of the differential signal will change, to the level-determining section. In response to the information signal received from the intermediate potential monitoring section, the level-determining section determines the level of the differential signal by performing a stabilizing operation such that the level determined is not affected by the change of the intermediate potential.

According to the present invention, if the intermediate potential of the differential signal is expected to change, the level-determining section determines the level of the differential signal by performing a stabilizing operation such that the level determined is not affected by the change of the intermediate potential. Thus, it is possible to avoid an unfavorable situation where a state machine included in a system utilizing the determined level changes into an unexpected state. As a result, the system can operate stably enough.

In one embodiment of the present invention, the level-determining section may perform the stabilizing operation by sampling the output of the comparator section multiple times during a level determination interval and may regard a most frequently sampled value as the level of the differential signal. In this manner, sampled values that have been estimated erroneously just once or a few times can be neglected. Thus, the level determination of the differential signal is not affected by the change of the intermediate potential.

In this particular embodiment, the level-determining section preferably samples the output of the comparator section at a frequency higher than that of a system clock signal for a system that receives the determined level as input.

In another embodiment of the present invention, the level-determining section may perform the stabilizing operation by fixing an input to the comparator section or an output of the comparator section during a level determination interval irrespective of a state of the differential signal. Since the input or output to/from the comparator section is fixed during the level determination interval irrespective of the state of the differential signal, the determined level of the differential signal is not affected by the change of the intermediate potential.

In a specific embodiment, the level-determining section may further include: a switch, provided on the input side of the comparator section, for selectively inputting the differential signal to the comparator section; and a storage section, provided between the comparator section and the switch, for retaining a potential difference represented by the differential signal to be input to the comparator section. During the level determination interval, the switch may be turned OFF such that the differential signal is not input to the comparator section and that the potential difference retained in the storage section is input to the comparator section.

In an alternate embodiment, the level-determining section may further include: a switch, provided on the output side of the comparator section, for selectively passing an output of the comparator section out of the level-determining section; and a storage section, provided on the opposite side of the comparator section with respect to the switch, for retaining the output of the comparator section that will be passed out of the level-determining section. During the level determination interval, the switch may be turned OFF such that the output of the comparator section is not passed out of the level-determining section and that the output of the comparator section retained in the storage section is passed out of the level-determining section.

In still another embodiment, the intermediate potential monitoring section may include means for sensing the intermediate potential. If the intermediate potential is expected to change considering a result obtained by the sensing means, the monitoring section may output the information signal.

Alternatively, the intermediate potential monitoring section may receive, as input, system information, which informs that the intermediate potential is expected to change. When the monitoring section knows from the system information that the intermediate potential is expected to change, the monitoring section may output the information signal.

In yet another embodiment, the comparator section may include: a master comparator, which receives the differential signal as differential input and supplies a sensed current corresponding to the potential difference represented by the differential input; and means for supplying an offset current. The comparator section may output a current representing a difference between the sensed and offset currents, and may determine whether or not a potential difference represented by the differential signal has exceeded an offset voltage. The offset current supply means may control the magnitude of the offset current by the intermediate potential of the differential signal so as to stabilize the offset voltage.

In still another embodiment, the comparator section may include: a first comparator, which receives the differential signal as differential input; a second comparator, which receives an inverted version of the differential signal as differential input; and a level determiner, which receives outputs of the first and second comparators as respective inputs and provides "1" or "0" when the outputs match each other or "Z" when the outputs do not match.

An inventive method for determining a level of a differential signal includes the steps of: inputting the differential signal to a comparator; determining whether or not an intermediate potential of the differential signal will change; and if the intermediate potential is expected to change, determining the level of the differential signal by an output of the comparator by performing a stabilizing operation such that the level determined is not affected by the change of the intermediate potential.

According to the present invention, if the intermediate potential of the differential signal is expected to change, the level of the differential signal is determined by performing a stabilizing operation such that the level determined is not affected by the change of the intermediate potential. Thus, it is possible to avoid an unfavorable situation where a state machine included in a system utilizing the determined level changes into an unexpected state. As a result, the system can operate stably enough.

In one embodiment of the present invention, the stabilizing operation may be performed by sampling the output of the comparator multiple times during a level determination interval and a most frequently sampled value may be regarded as the level of the differential signal. In this manner, sampled values that have been estimated erroneously just once or a few times can be neglected. Thus, the level determination of the differential signal is not affected by the change of the intermediate potential.

Alternatively, the stabilizing operation may also be performed by fixing an input to the comparator or an output of the comparator during a level determination interval irrespective of a state of the differential signal. Since the input or output to/from the comparator is fixed during the level determination interval irrespective of the state of the differential signal, the determined level of the differential signal is not affected by the change of the intermediate potential.

In this particular embodiment, the input to the comparator or the output of the comparator is preferably fixed at such a value as stabilizing a state machine included in a system using the determined level of the differential signal.

Another inventive method for determining a level of a differential signal includes the steps of: a) inputting the differential signal to a comparator section, the comparator section including a comparator for determining whether or not a potential difference represented by the differential signal has exceeded an offset voltage; and b) determining the level of the differential signal by an output of the comparator section. The comparator section comprises: a master comparator, which receives the differential signal as differential input and supplies a sensed current corresponding to the potential difference represented by the differential input; and means for supplying an offset current. The comparator section outputs a current representing a difference between the sensed and offset currents. The offset current supply means controls the magnitude of the offset current by an intermediate potential of the differential signal so as to stabilize the offset voltage and to determine the level of the differential signal stably with respect to a static change of the intermediate potential of the differential signal. A stabilizing operation is performed in the step b) such that the level of the differential signal is determined stably even against a dynamic change of the intermediate potential of the differential signal without being affected by the change of the intermediate potential.

BRIEF DESCRIPTION OF THE DRAWINGS

FIG. 8(a) illustrates a conventional level determination technique;

FIG. 8(b) illustrates another conventional level determination technique where a skew is caused in a system clock signal; and FIG. 8(c) illustrates a level determination technique according to a second embodiment of the present invention.

DESCRIPTION OF THE PREFERRED EMBODIMENTS

EMBODIMENT 1

Figure 1:
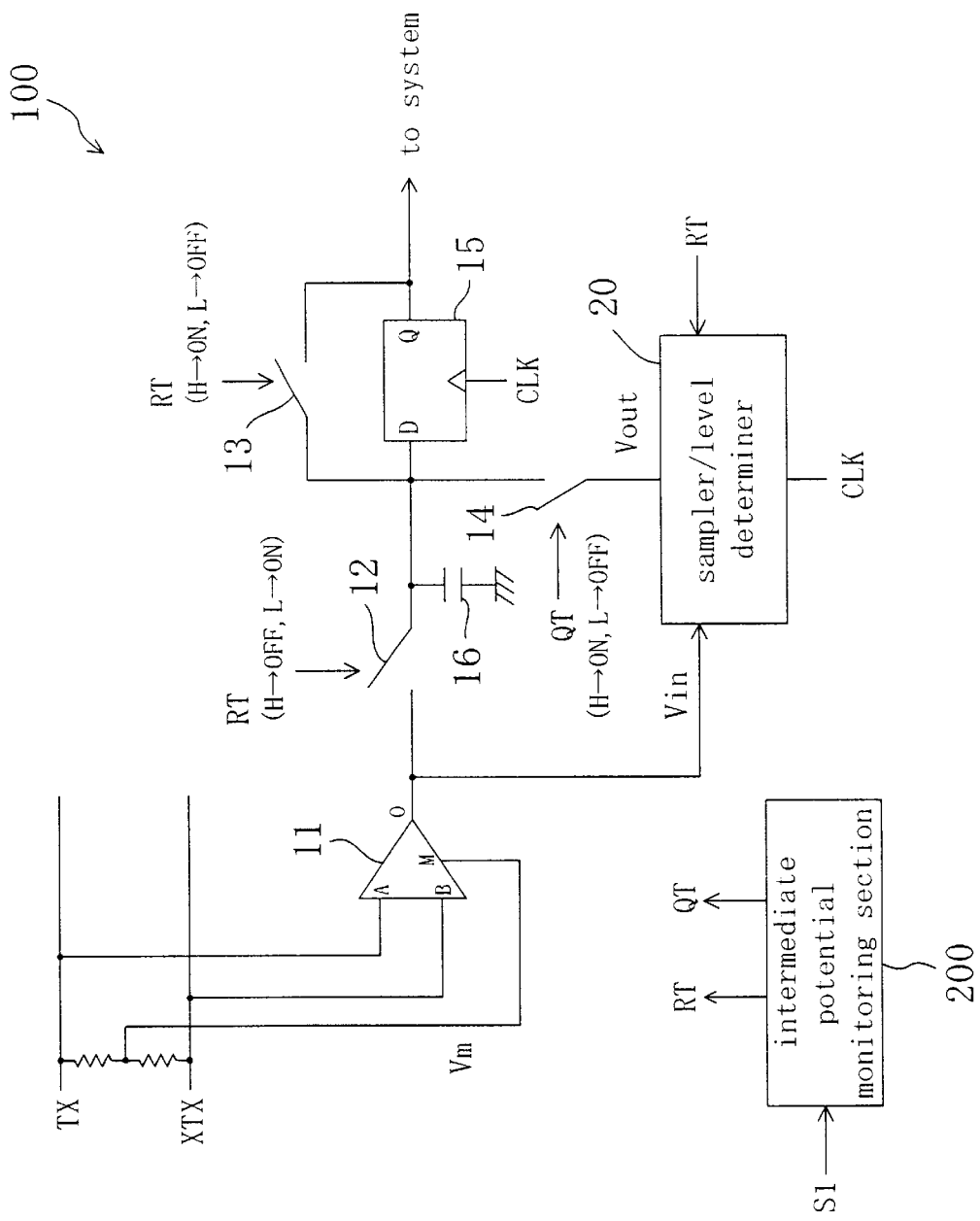
FIG. 1 illustrates a configuration for a differential signal level determination circuit according to a first embodiment of the present invention.

FIG. 1 illustrates a configuration for a differential signal level determination circuit according to a first embodiment of the present invention. As shown in FIG. 1, the level determination circuit includes an offsetting comparator 11 receiving a differential signal (TX, XTX) that has been transmitted through a pair of transmission lines TX and XTX. The comparator 11 is equivalent to the comparator section as defined in the appended claims. The level determination circuit further includes a sampler/level determiner 20 that receives the output of the comparator 11 as input Vin and determines the level of the differential signal by sampling the input Vin a number of times. More specifically, the sampler/level determiner 20 outputs the most frequently sampled value of the input Vin as the level Vout of the differential signal.

A flip-flop 15 is provided on the output side of the sampler/level determiner 20. The output terminal of the sampler/level determiner 20 is connected to the D-input terminal of the flip-flop 15 by way of a switch 14. The D-input terminal of the flip-flop 15 is also connected to the output terminal of the offsetting comparator 11 via a switch 12 and to its own Q-output terminal through a switch 13. A capacitor 16 for storing the output of the comparator 11 is provided between the switch 12 and the D-input terminal of the flip-flop 15. It should be noted that the capacitor 16 may be parasitic capacitance. Also, the Q-output of the flip-flop 15 is provided as a value of the differential signal to a system.

A level-determining section 100 is made up of the comparator 11, switches 12, 13, 14, flip-flop 15, capacitor 16 and sampler/level determiner 20.

The differential signal level determination circuit further includes an intermediate potential monitoring section 200 that receives system information S1 informing that the intermediate potential Vm of the differential signal (TX, XTX) is expected to change. The monitoring section 200 outputs signals RT and QT. When the monitoring section 200 knows from the system information S1 that the intermediate potential Vm will change, the monitoring section 200 asserts the signal RT to H level as an information signal. As a result, the switch 12 is opened (i.e., turned OFF) and the output of the comparator 11 is not provided to the system. Instead, the output Vout of the sampler/level determiner 20 is provided as the value of the differential signal (TX, XTX) to the system.

Examples of the system information S1 include information representing the power ON/OFF state of a unit including this differential signal level determination circuit and information representing the plugged-in or pulled-out state of a cable that transmits the differential signal (TX, XTX). It is expected that the intermediate potential Vm of the differential signal (TX, XTX) will change steeply when the power is turned ON or OFF or when the cable is plugged in or pulled out. Thus, in such a situation, the intermediate potential monitoring section 200 asserts the signal RT to H level, thereby sending the information signal to the determining section 100.

The intermediate potential Vm may be defined at any value so long as the potential Vm can represent the level of the differential signal (TX, XTX). The intermediate potential Vm is herein supposed to be the center potential (i.e., average potential) of the differential signal (TX, XTX).

Figure 2:
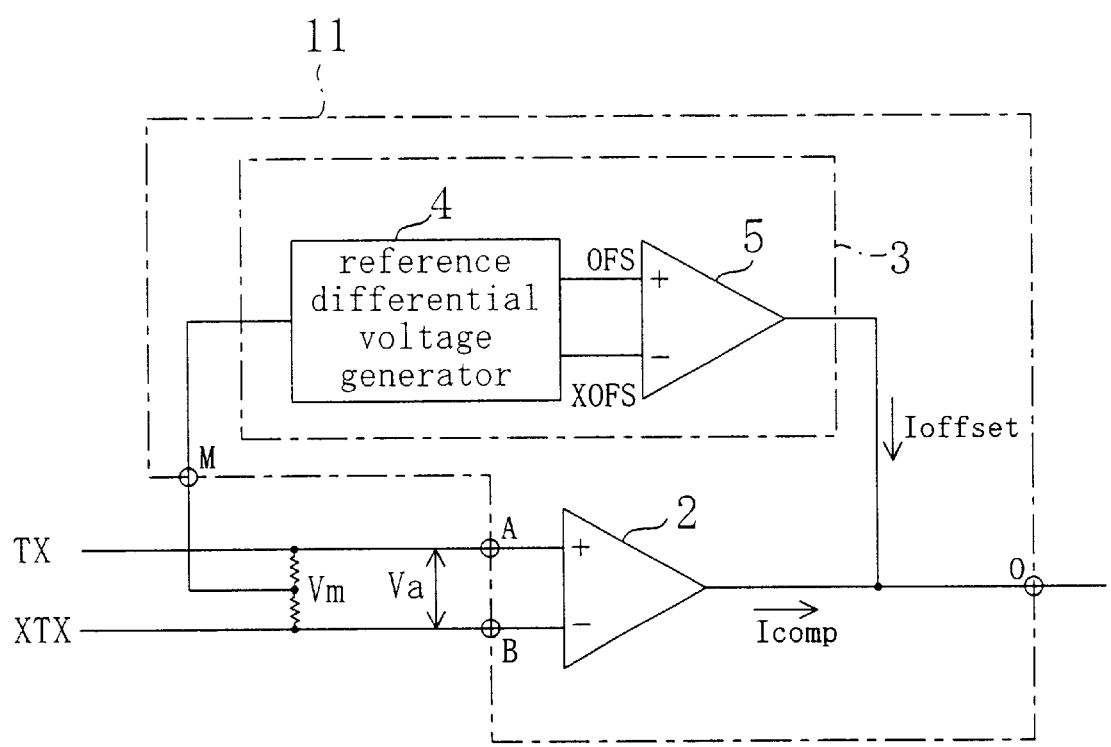
FIG. 2 illustrates a schematic configuration for the comparator 11 shown in FIG. 1.

FIG. 2 illustrates a schematic configuration for the offsetting comparator 11 shown in FIG. 1. As shown in FIG. 2, the comparator 11 includes a master comparator 2 and offset current supply means 3 for supplying offset current Ioffset. The master comparator 3 receives the differential signal (TX, XTX) as differential input and supplies a sensed current Icomp corresponding to the potential difference Va represented by the differential input (or signal). The offset current supply means 3 includes a reference differential voltage generator 4 and a slave comparator 5. The reference differential voltage generator 4 receives an intermediate potential Vm represented by the differential signal (TX, XTX) and outputs a reference differential voltage (OFS, XOFS) corresponding to the intermediate potential Vm. The slave comparator 5 receives the reference differential voltage (OFS, XOFS) and supplies the offset current Ioffset corresponding to the potential difference represented by the reference differential voltage (OFS, XOFS).

The master and slave comparators 2 and 5 are connected to a common output node, through which the comparator 11 outputs a current representing a difference between the sensed and offset currents Icomp and Ioffset. In this manner, the comparator 11 shown in FIG. 2 shows an offset in the input/output characteristics thereof.

The master and slave comparators 2 and 5 have "the same" circuit configuration. Actually, though, these comparators 2 and 5 have only to have substantially the same configurations, not completely. Examples of specific requirements include that transistors of almost the same size are connected together in a similar manner to form the circuit and that the dependence on the operation specifications, potential Vm and supply voltage thereof is substantially the same.

Figure 3:
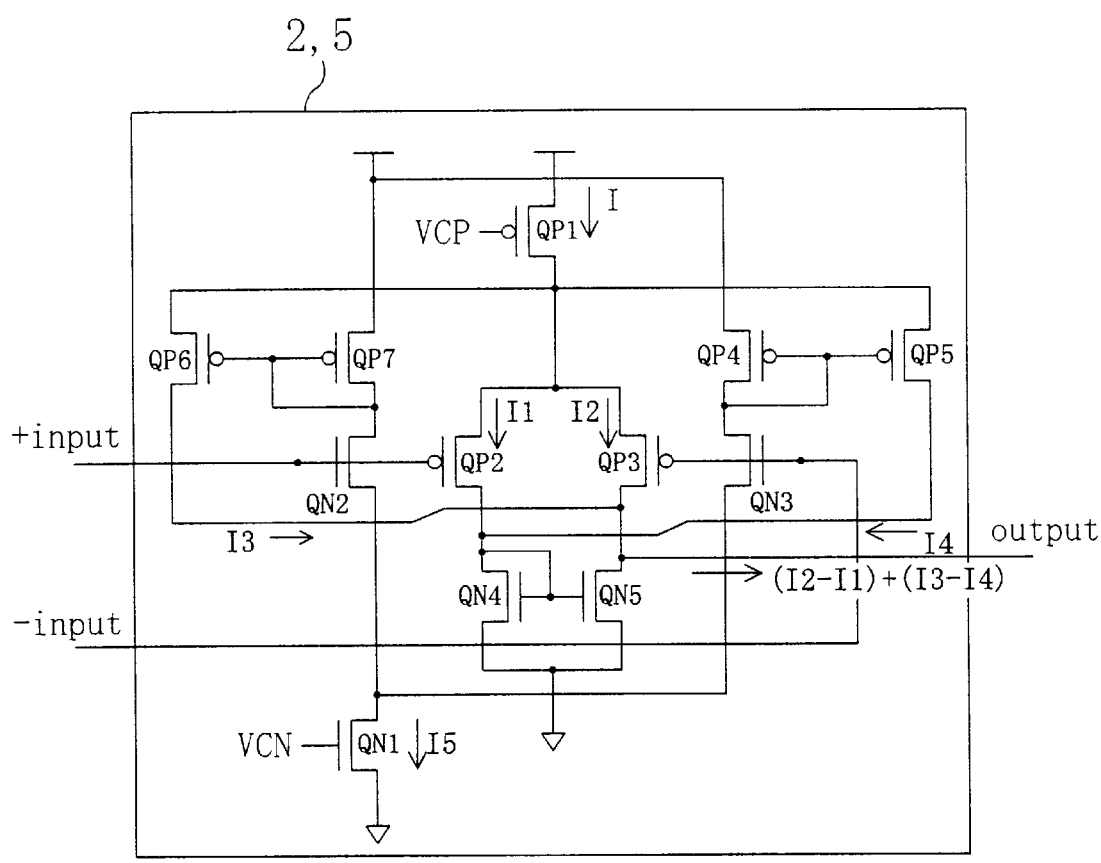
FIG. 3 illustrates an exemplary circuit configuration for the master and slave comparators 2 and 5 shown in FIG. 2.

FIG. 3 illustrates a specific exemplary circuit configuration for the master and slave comparators 2 and 5 shown in FIG. 2. The circuit shown in FIG. 3 receives the differential signal (TX, XTX) with a center potential variable almost between the ground and supply voltages, and therefore receives the differential input at the parallel gates of p-channel transistors QP2 and QP3 and n-channel transistors QN2 and QN3.

In FIG. 3, the current flowing through the p-channel transistor QP2 receiving the non-inverted input at its gate is identified by I1. The current flowing through the p-channel transistor QP3 receiving the inverted input at its gate is identified by I2. The current flowing through the n-channel transistor QN2 (i.e., the current flowing through the p-channel transistor QP6 by way of a current mirror) receiving the non-inverted input at its gate is identified by I3. And the current flowing through the n-channel transistor QN3 (i.e., the current flowing through the p-channel transistor QP5 by way of another current mirror) receiving the inverted input at its gate is identified by I4. In this case, the output current is represented as $\{(I2-I1)+(I3-I4)\}$. That is to say, this output current is equivalent to the sensed current Icomp of the master comparator 2 and to the offset current Ioffset of the slave comparator 5. First, second and third pairs of transistors are made up of the p-channel transistors QP2 and QP3, n-channel transistors QN2 and QN3 and p-channel transistors QP5 and QP6, respectively.

The slave comparator 5 for outputting the offset current Ioffset has totally the same configuration as the master comparator 2 and includes the same input transistors QP2, QP3, QN2 and QN3, load circuit and current mirror circuits provided for the currents flowing through the input transistors. Accordingly, the sensed current Icomp of the master comparator 2 and the offset current Ioffset of the slave comparator 5 change similarly with a variation in potential of the differential input.

Also, the circuit configuration shown in FIG. 3 is highly resistant to the variation in potential of the differential input. As can be seen from FIG. 3, the sources of the transistors QP2, QP3, QP6 and QP5 making the currents I1, I2, I3 and I4 flow, respectively, are all connected to the drain of the p-channel transistor QP1 functioning as a constant current source. Accordingly, even if the potential represented by the differential input has changed, the total amount of currents I $(=I1+I2+I3+I4)$ is kept constant.

Figure 4:
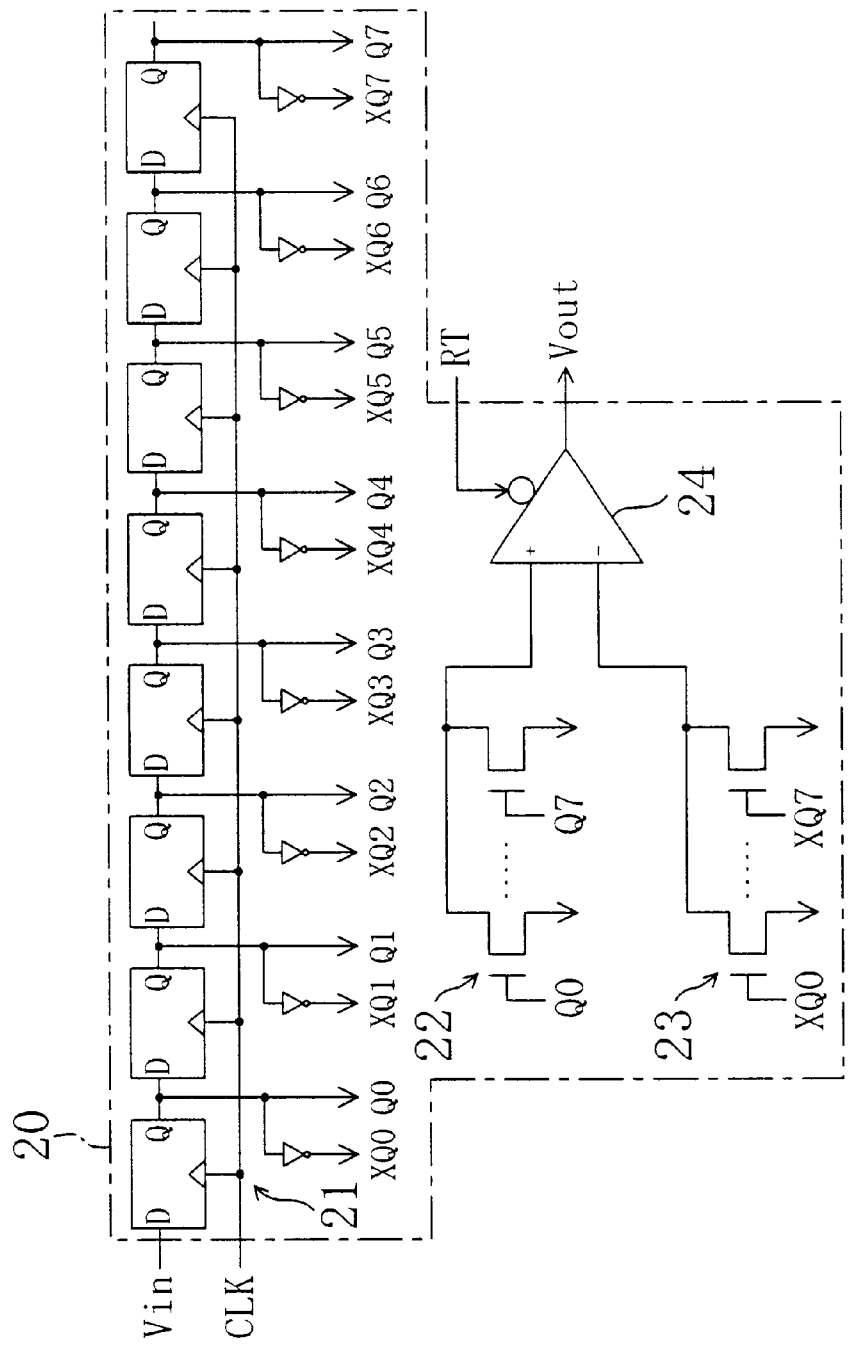
FIG. 4 is a circuit diagram illustrating an internal configuration of the sampler/level determiner 20 shown in FIG. 1.

FIG. 4 is a circuit diagram illustrating an internal configuration of the sampler/level determiner 20. As shown in FIG. 4, the sampler/level determiner 20 includes a bank 21 of flip-flops that are connected in series together. In the flip-flop on the first stage of the bank 21, the input Vin to the sampler/level determiner 20 is provided to the D-input terminal thereof. The sampler/level determiner 20 further includes a first bank 22 of NMOS transistors that are connected in parallel to each other. The output signals Q0 through Q7 of the respective flip-flops in the bank 21 are provided to the corresponding gates of the NMOS transistors in the first bank 22. The sampler/level determiner 20 further includes a second bank 23 of NMOS transistors that are also connected in parallel to each other. The inverted versions XQ0 through XQ7 of the output signals Q0 through Q7 of the respective flip-flops in the bank 21 are provided to the corresponding gates of the NMOS transistors in the second bank 23. The sampler/level determiner 20 further includes a comparator 24. The comparator 24 receives drain potentials of the first and second transistor banks 22 and 23 as non-inverted and inverted inputs, respectively. The output of the comparator 24 is provided as the output Vout of the sampler/level determiner 20.

Figure 5:
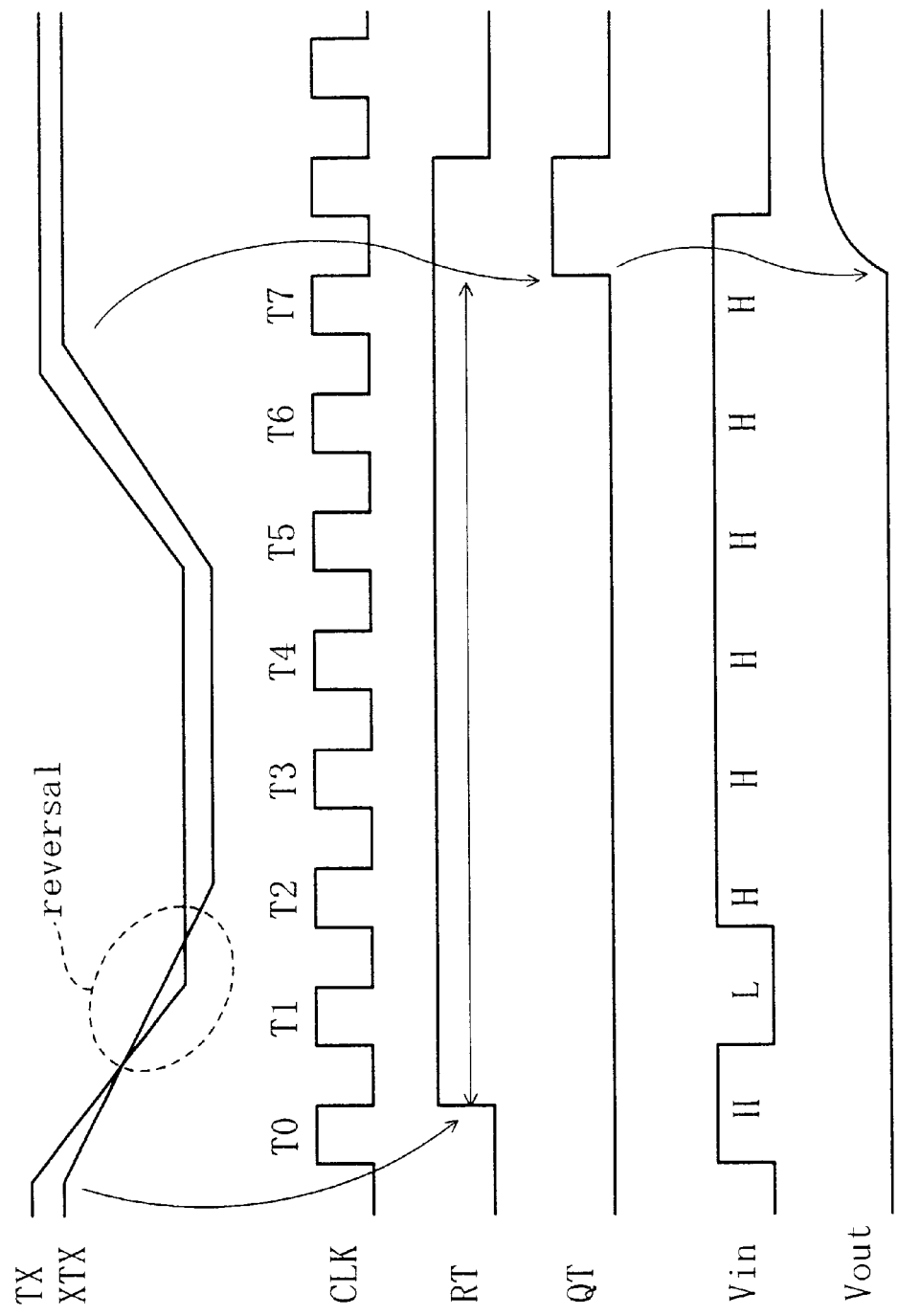
FIG. 5 is a timing diagram illustrating variations in levels of respective signals for the level determination circuit shown in FIG. 1.
Figures 17A, 17B, 17C:
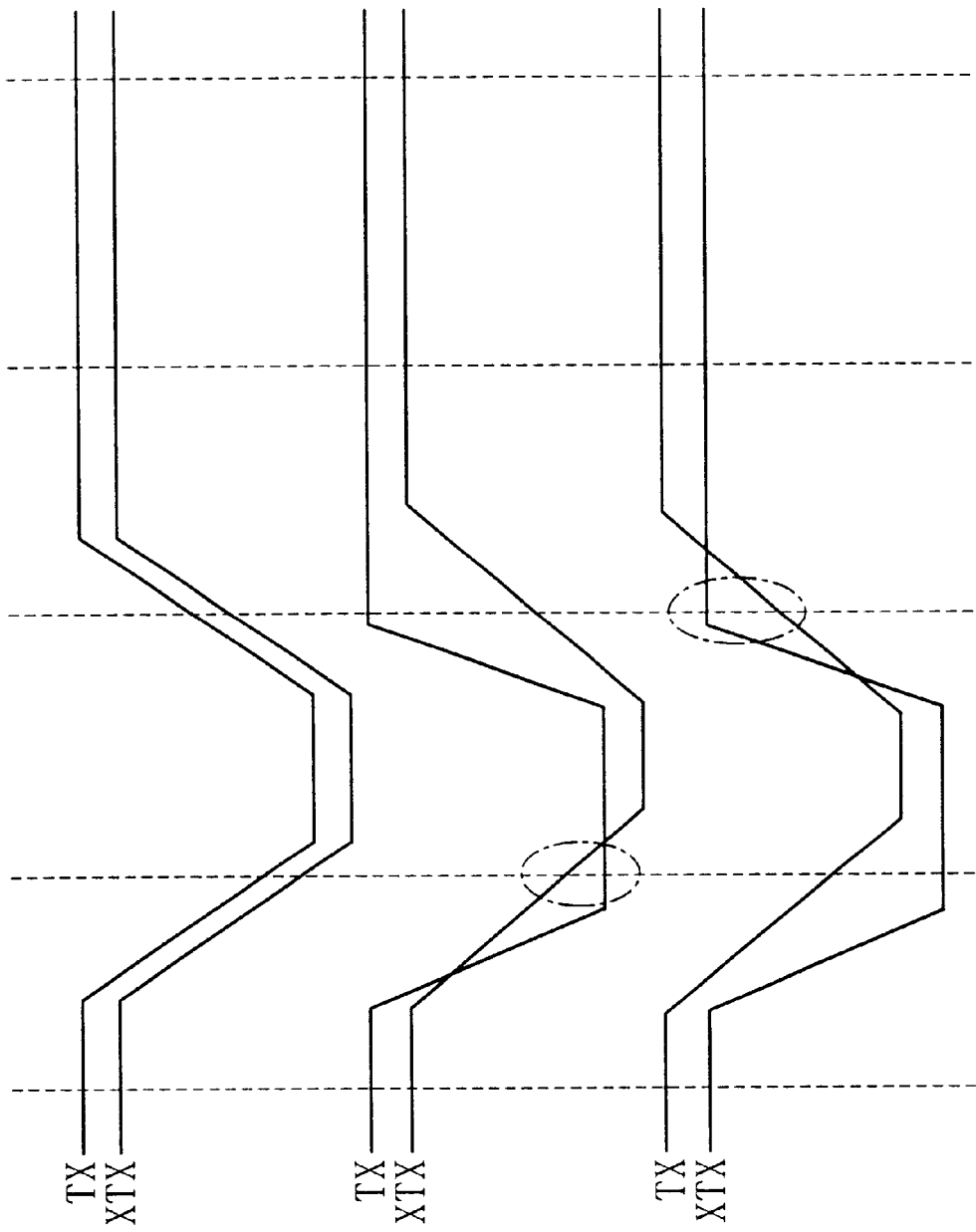
FIGS. 17(a) through 17(c) illustrate how the potential levels change when the in-phase potentials of differential transmission lines are dropping at a high speed.

FIG. 5 is a timing diagram illustrating variations in levels of respective signals for the level determination circuit shown in FIGS. 1 through 4. In the illustrated example, the potential level standings of the differential signal (TX, XTX) are reversed instantaneously while the potentials are dropping as in FIG. 17(b). In such a situation, the sampler/level determiner 20 performs a stabilizing operation in the following manner such that the level determined is not affected by the variation in intermediate potential Vm. Specifically, as shown in FIG. 5, the sampler/level determiner 20 samples the output Vin of the comparator 11 a number of times synchronously with a system clock signal CLK during an interval in which the potential level standings of the differential signal remain the same. The interval is determined by the number of bits complying with a protocol. The sampler/level determiner 20 regards a most frequently sampled value as the level Vout of the differential signal. Also, during the sampling interval, the signals RT and QT are fixed at H and L levels, respectively, thereby fixing the value output to the system. And as soon as the value of the differential signal is determined as a result of sampling, the value is output.

In this manner, sampled values that have been estimated erroneously just once or a few times can be neglected. Thus, it is possible to avoid an unfavorable situation where a state machine included in the system changes into an unexpected state. As a result, the system can operate stably enough.

Modified Example of Embodiment 1

In the first embodiment, if the interval defined by the standard, i.e., the sampling interval, is much longer than the period of the system clock signal, there is no problem at all. However, if the standardized interval is shorter than the period of the system clock signal, then the output cannot be sampled a number of times.

In such a situation, by using the edges of a multi-phase clock pulses, which have been extracted from a voltage controlled oscillator (VCO) in a PLL circuit for generating the system clock signal, the output can still be sampled a number of times. As a result, the same effects as the first embodiment are attainable.

Figure 6:
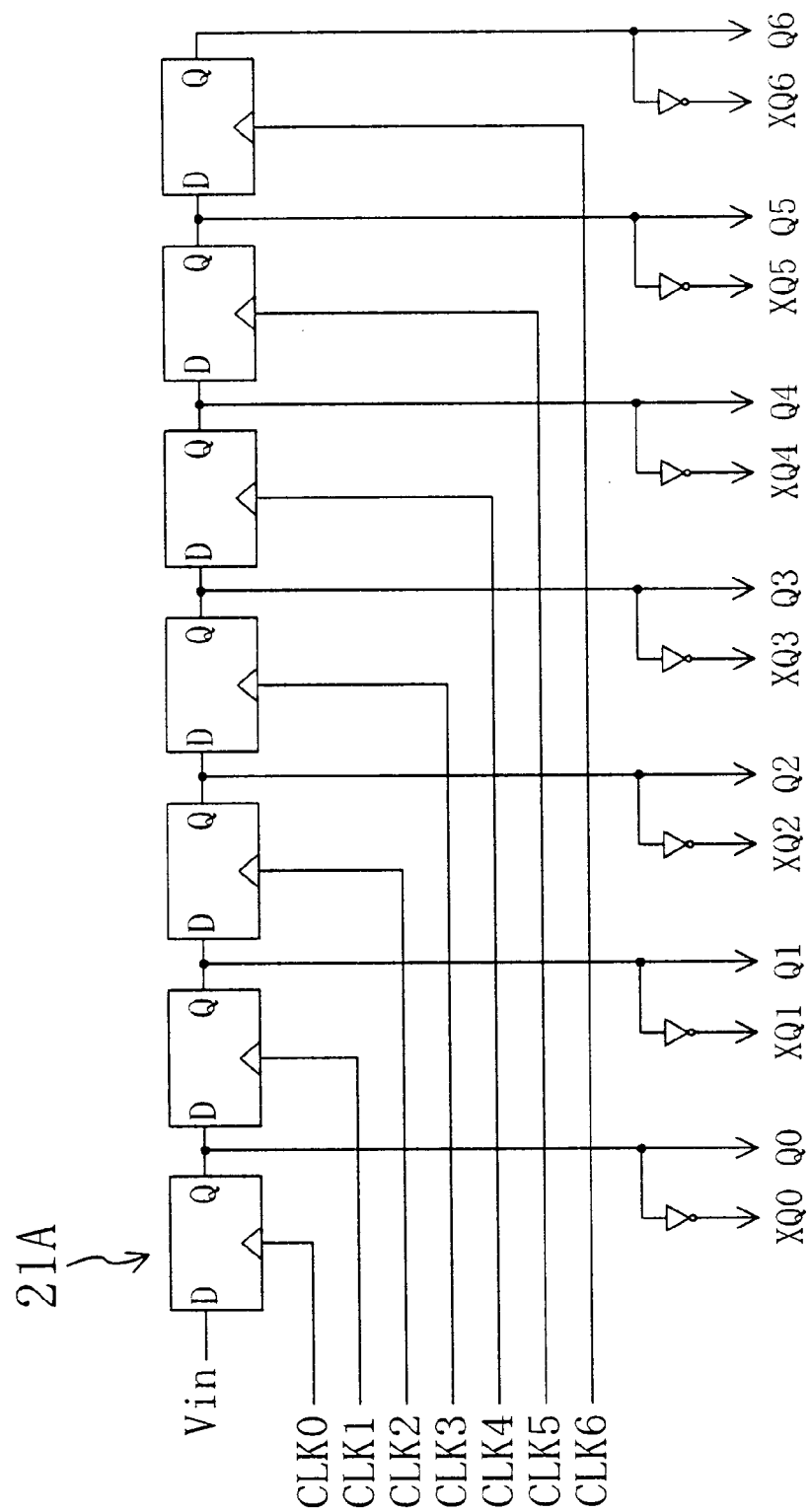
FIG. 6 illustrates a bank of flip-flops as an exemplary sampler according to a modified example of the first embodiment.
Figure 7:
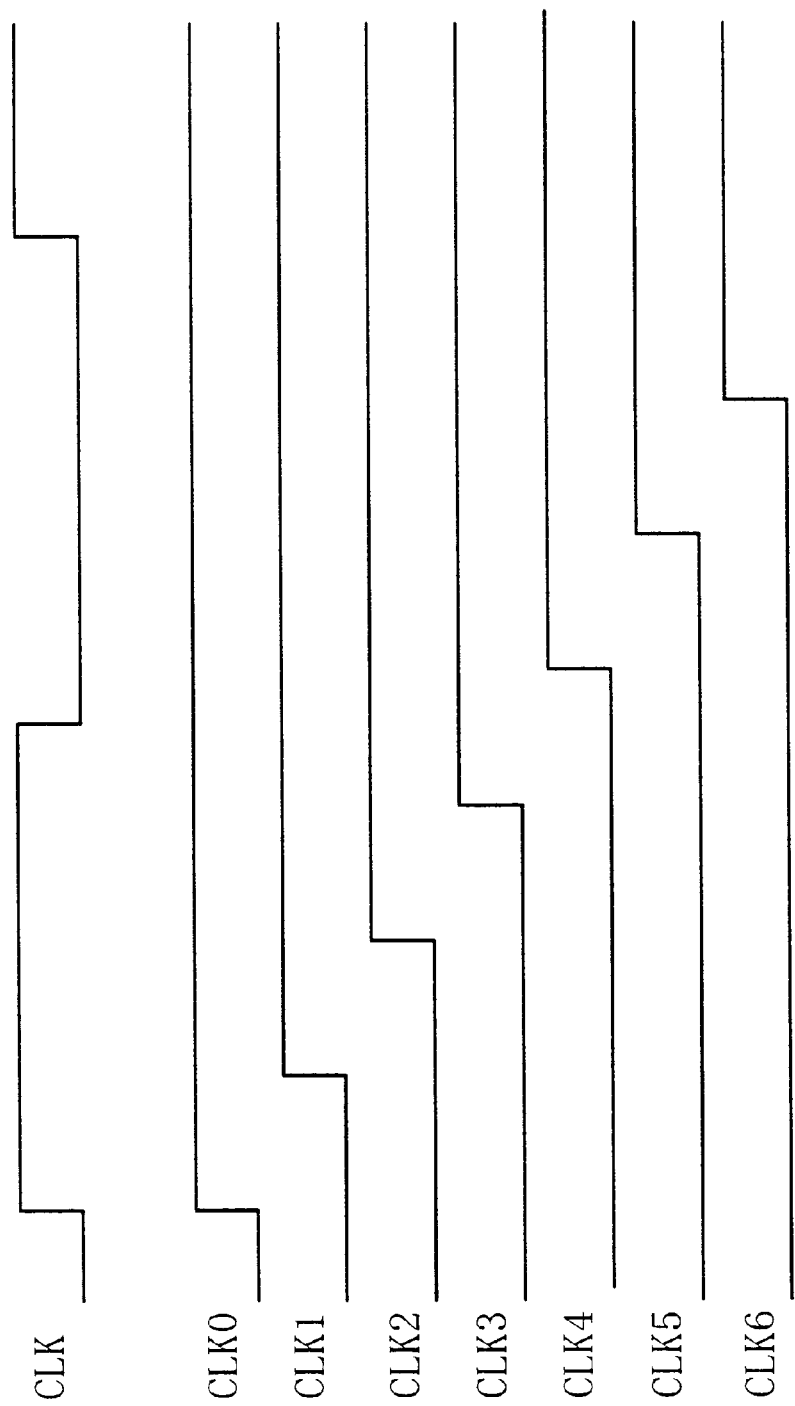
FIG. 7 is a timing diagram illustrating multi-phase clock pulses delivered to the bank of flip-flops shown in FIG. 6.

FIG. 6 illustrates an alternate bank 21A of flip-flops, which is an exemplary sampler according to this modified example. Multi-phase clock pulses CLK0 through CLK6 such as those illustrated in FIG. 7, which have been extracted from the VCO in the PLL circuit for generating the system clock signal CLK, are delivered to the respective flip-flops in the bank 21A shown in FIG. 6. By using a bank 21A like this in place of the bank 21 shown in FIG. 4, sampling can be carried out a number of times as in the first embodiment even if the standardized interval is shorter than the period of the system clock signal.

The offsetting comparator with the configuration shown in FIGS. 2 and 3 exhibits very stabilized characteristics with respect to static change in intermediate potential Vm. However, since the comparator is so constructed as to refer to the intermediate potential Vm, the comparator is apt to react excessively to dynamic change in intermediate potential Vm. Thus, by performing sampling as an exemplary stabilizing operation as is done in this embodiment, the differential signal level determination circuit can exhibit stabilized operation characteristics even against such dynamic change of the intermediate potential Vm.

If the intermediate potential Vm changes statically (e.g., rises toward the supply voltage due to a difference in ground potential among various components, for example) or slowly in more than several hundreds nanoseconds, then the offset-current-compensating comparator shown in FIGS. 2 and 3 can operate very stably. However, if the intermediate potential Vm changes steeply and rapidly (i.e., in several hundreds nanoseconds or less) as in Mode 2 (or speed signaling) to be described later, then the offset-current-compensating comparator cannot always operate stably enough. Accordingly, by making the level-determining section perform a stabilizing operation digitally on the output of the comparator with low reliability, the accuracy of the signal value is compensated for.

The comparator 11 does not have to be constructed as shown in FIGS. 2 and 3. Thus, the present invention is effectively applicable to a comparator that does not refer to the intermediate potential Vm.

Also, since the types of information provided as the system information S1 are known, the intermediate potential monitoring section 200 is easily implementable as logic circuits, for example. Furthermore, the intermediate potential monitoring section 200 does not have to receive the system information S1 but may directly receive the intermediate potential Vm by using means for sensing the intermediate potential Vm of the differential signal additionally provided therefor. In such an alternative embodiment, when the section 200 detects a change of the intermediate potential Vm based on the result sensed by that means, the section 200 may assert the signal RT to H level.

EMBODIMENT 2

Figure 8A:
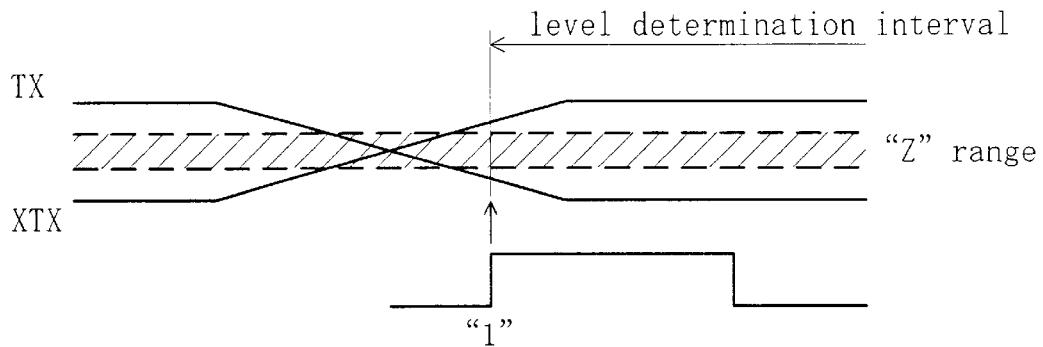
FIGS. 8(a), 8(b) and 8(c) illustrate how to determine the level of a differential signal in transition.
Figure 8B:
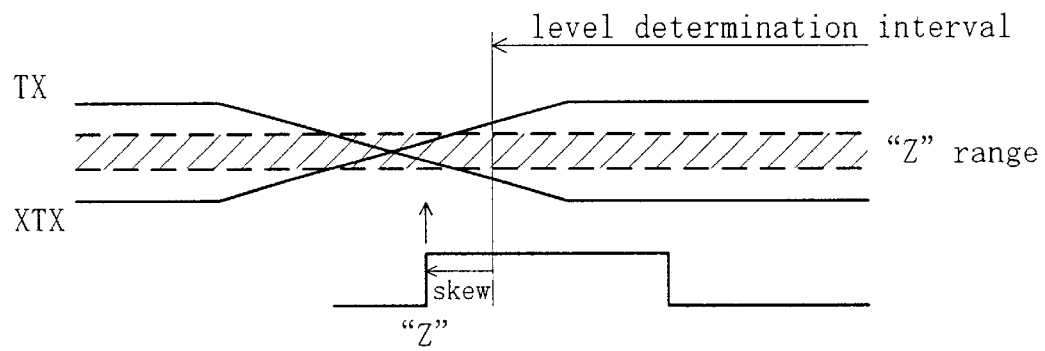
Figure 8C:
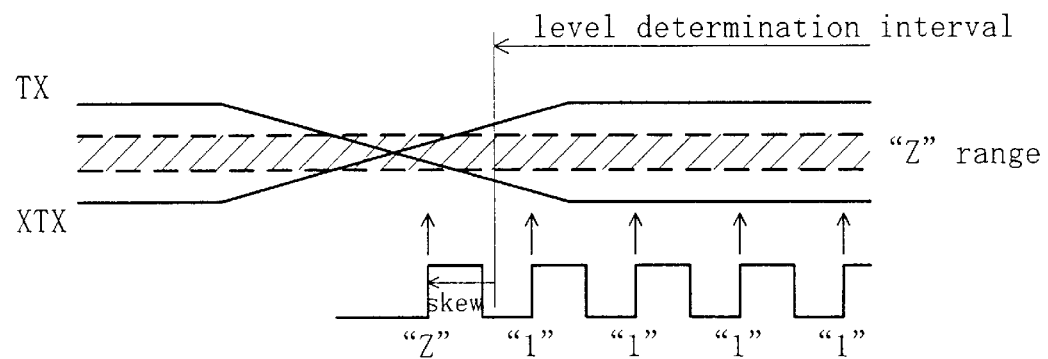

FIGS. 8(a), 8(b) and 8(c) illustrate how to determine the level of a differential signal in transition. As shown in FIG. 8(a), the level of the differential signal is usually determined in accordance with the conventional technique after a predetermined time has passed since the differential signal started to change its level. However, if the level is determined earlier than the beginning of the actual level determination interval due to a skew of a system clock signal as shown in FIG. 8(b), then the level is unintentionally determined during the transition of the differential signal. In such a case, a signal with a level that should have been regarded as "1" or "0" might be determined as "Z" by mistake. In addition, if the differential signal changes its level relatively slowly, the level of the differential signal might also be determined erroneously.

Thus, according to this embodiment, the value of the differential signal, which has been determined using two offsetting comparators, is sampled a number of times and the most frequently sampled value is regarded as the level of the differential signal as in the first embodiment and as shown in FIG. 8(c).

Figure 9:
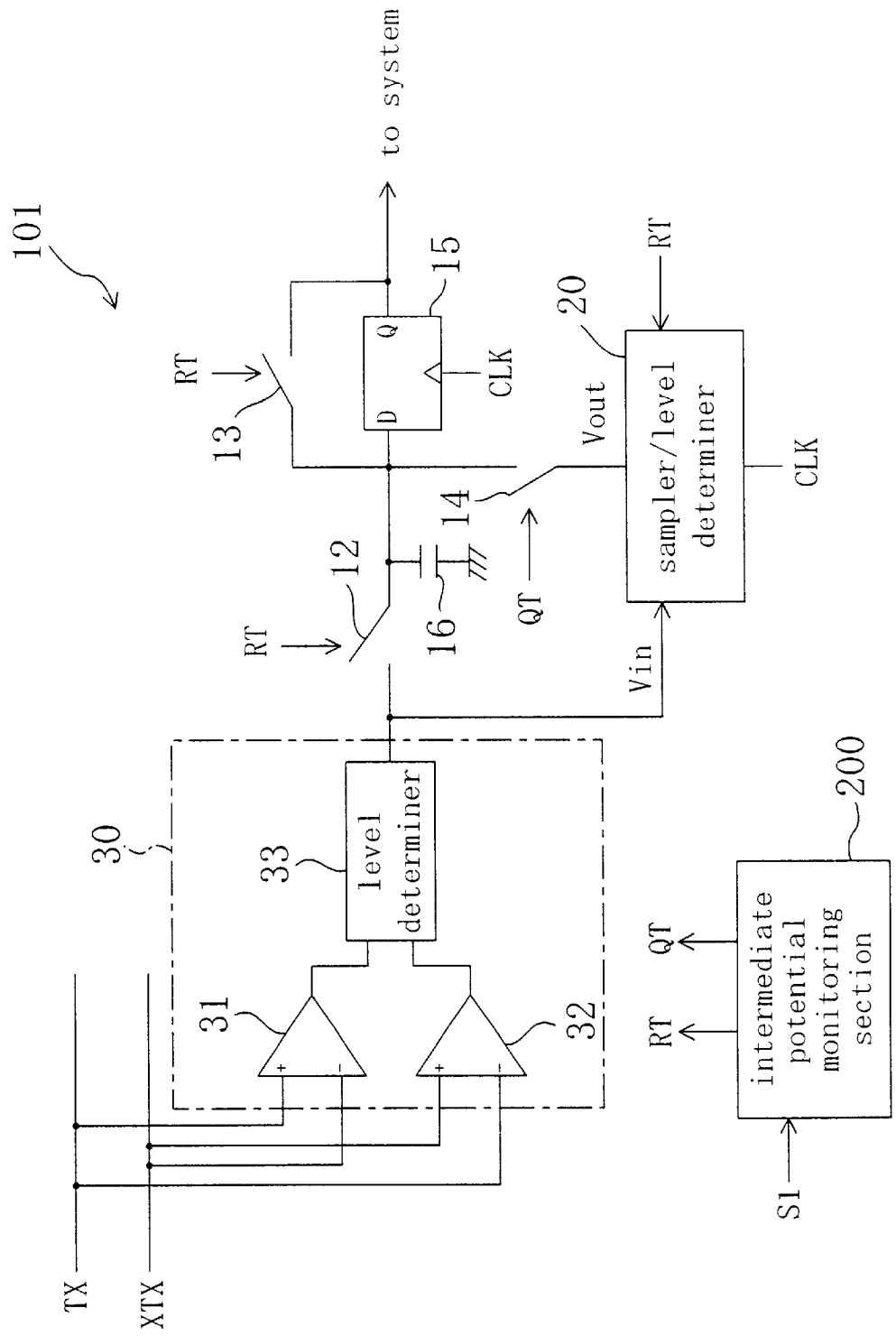
FIG. 9 illustrates a configuration for a differential signal level determination circuit according to the second embodiment.

FIG. 9 illustrates a configuration for a differential signal level determination circuit according to a second embodiment of the present invention. In FIG. 9, the same components as the counterparts illustrated in FIG. 1 are identified by the same reference numerals and the description thereof will be omitted herein.

As shown in FIG. 9, the differential signal level determination circuit includes first and second offsetting comparators 31 and 32 and a level determiner 33. The first comparator 31 receives the differential signal (TX, XTX) as differential input. The second comparator 32 receives an inverted version of the differential signal (TX, XTX) as differential input. And the level determiner 33 receives the outputs of the first and second comparators 31 and 32 as respective inputs and provides "1" or "0" when the outputs match each other or "Z" when the outputs do not match. The first and second comparators 31 and 32 and the level determiner 33 together constitute a comparator section 30. And a level-determining section 101 is made up of the comparator section 30, switches 12, 13, 14, flip-flop 15, capacitor 16 and sampler/level determiner 20.

In the level determination circuit shown in FIG. 9, the sampler/level determiner 20 samples the output of the comparator section 30 a number of times and regards the most frequently sampled value as the level of the differential signal. In this manner, the level of the differential signal can be determined correctly even if at least one of the sampled values is erroneous as shown in FIG. 8(c).

The comparators 31 and 32 may be so constructed as to refer to the intermediate potential Vm as in the first embodiment.

EMBODIMENT 3

According to a third embodiment of the present invention, if the intermediate potential Vm changes, the stabilizng operation is performed by fixing the input or output to/from the comparator section irrespective of the state of the differential signal during the level determination interval.

Figure 10:
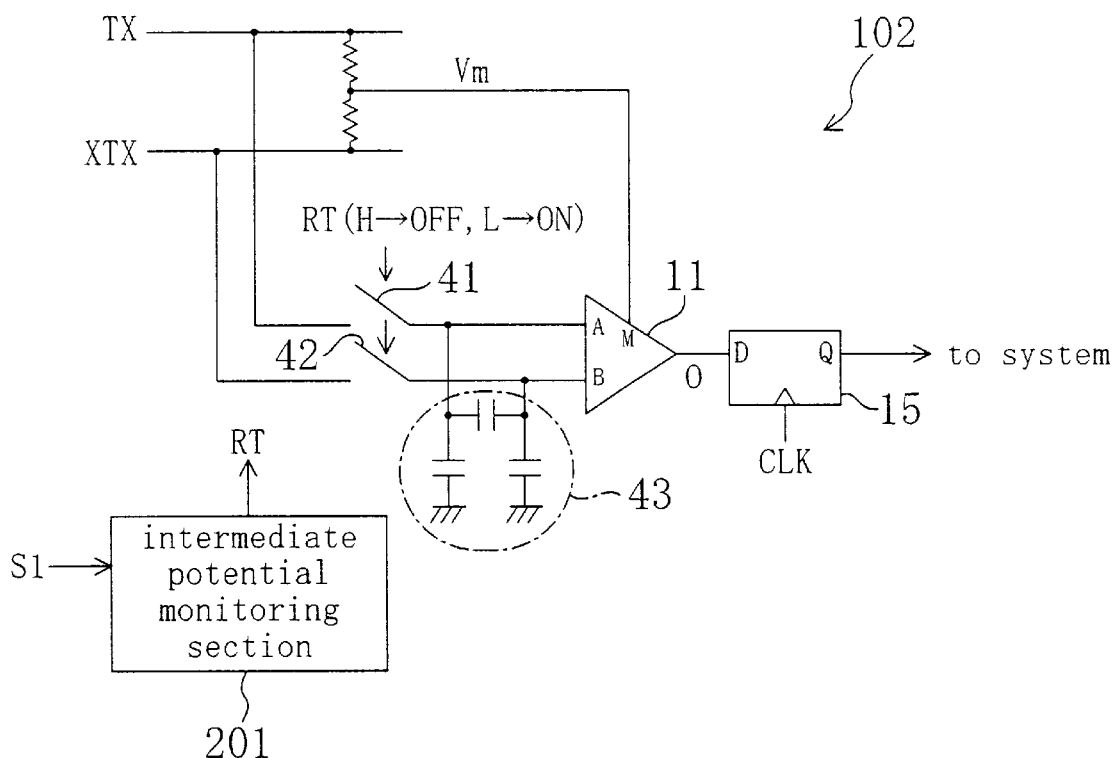
FIG. 10 illustrates a configuration for a differential signal level determination circuit according to a third embodiment of the present invention.

FIG. 10 illustrates a configuration for a differential signal level determination circuit according to the third embodiment. In FIG. 10, the same components as the counterparts illustrated in FIG. 1 are identified by the same reference numerals and the description thereof will be omitted herein.

As shown in FIG. 10, switches 41 and 42 for selectively inputting the differential signal (TX, XTX) are provided on the input side of the comparator section 11. And a storage section 43, like a capacitor, for retaining a potential difference represented by the differential signal that will be input to the comparator section 11 is provided between the switches 41, 42 and the comparator section 11. The comparator section 11, flip-flop 15, switches 41, 42 and storage section 43 together constitute a level-determining section 102. An intermediate potential monitoring section 201 receives the system information S1 as input. When the section 201 knows from the system information S1 that the differential signal (TX, XTX) is expected to change, the monitoring section 201 asserts the signal RT to H level as an information signal.

The ON/OFF states of the switches 41 and 42 are controlled in response to the signal RT. During the level determination interval, these switches 41 and 42 are opened (i.e., turned OFF) such that the differential signal (TX, XTX) is not input to the comparator section 11. On the other hand, the comparator section 11 receives the potential difference that has been retained in the storage section 43 as differential input and determines the level of the differential signal (TX, XTX) by the output during the level determination interval. That is to say, if the intermediate potential of the differential signal (TX, XTX) changes steeply, the level of the differential signal (TX, XTX) is determined by the potential difference of the previously retained differential signal (TX, XTX). Thus, it is possible to avoid an unfavorable situation where a state machine included in the system changes into an unexpected state. As a result, the system can operate stably enough.

Figure 11:
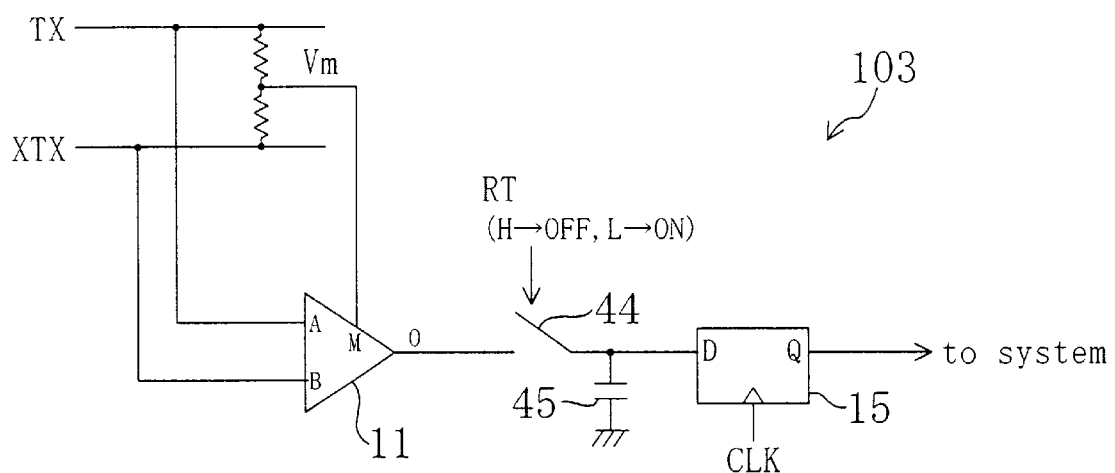
FIG. 11 illustrates another configuration for the differential signal level determination circuit according to the third embodiment.

FIG. 11 illustrates another configuration for the differential signal level determination circuit according to the third embodiment. In the configuration shown in FIG. 11, a switch 44 and a storage section 45 such as a capacitor are provided on the output side of the comparator section 11, not the input side thereof. The comparator section 11, flip-flop 15, switch 44 and storage section 45 together constitute a level-determining section 103. The switch 44 is provided to selectively pass the output of the comparator section 11 out of the level-determining section 103. The storage section 45 is provided for retaining the output of the comparator section 11 that will be passed out of the level-determining section 103. The switch 44 and the storage section 45 may also be provided on the output side of the flip-flop 15.

The ON/OFF states of the switch 44 are controlled in response to the signal RT. During the level determination interval, the switch 44 is opened (i.e., turned OFF) such that the output of the comparator section 11 is not passed out of the level-determining section 103. Also, during the level determination interval, the output of the comparator section 11, which is retained in the storage section 45, is provided as the level of the differential signal (TX, XTX) to the system. That is to say, if the intermediate potential of the differential signal (TX, XTX) changes steeply, the previously retained output of the comparator section 11 is provided as the level of the differential signal (TX, XTX). Thus, it is possible to avoid an unfavorable situation where a state machine included in the system changes into an unexpected state. As a result, the system can operate stably enough.

Modified Example of Embodiment 3

Figure 12:
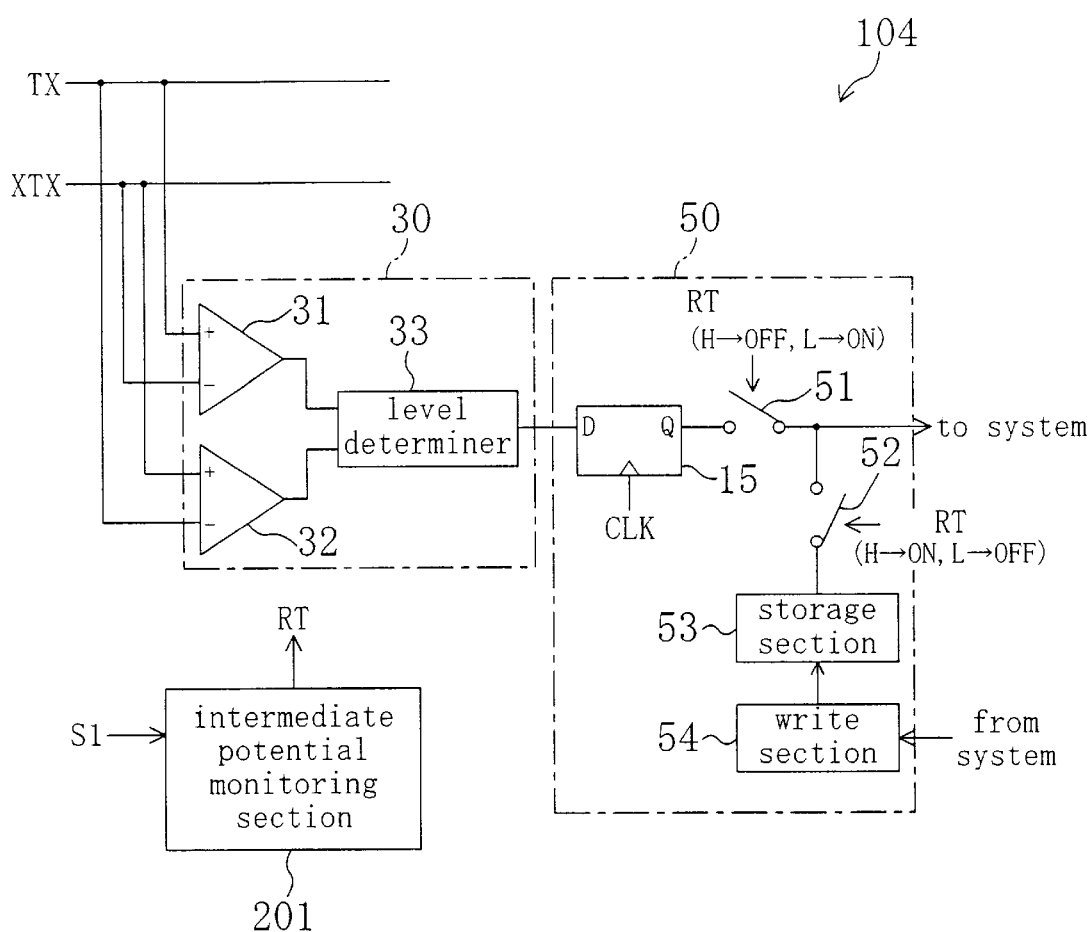
FIG. 12 illustrates a configuration for a differential signal level determination circuit according to a modified example of the third embodiment.

FIG. 12 illustrates a configuration for a differential signal level determination circuit according to a modified example of the third embodiment. In the circuit illustrated in FIG. 12, the output of the comparator section 30, which is retained on a storage section 53, can be updated by the system via a write section 54. The storage section 53 is implementable either as a capacitor or as a latch, flip-flop or the like logical element. The flip-flop 15, switches 51, 52, storage section 53 and write section 54 together constitute a final determination section 50. And a level-determining section 104 is made up of the comparator section 30 and the final determination section 50.

While a state machine in the system is in a particular state, for example, the write section 54 fixes the value stored on the storage section 53 to such a value as preventing an unexpected state transition of the state machine. As a result, the system can operate even more stably. It is naturally possible to fix the value stored on the storage section 53 to a predetermined value that prevents an unexpected state transition of the state machine irrespective of the state thereof.

Figure 13:
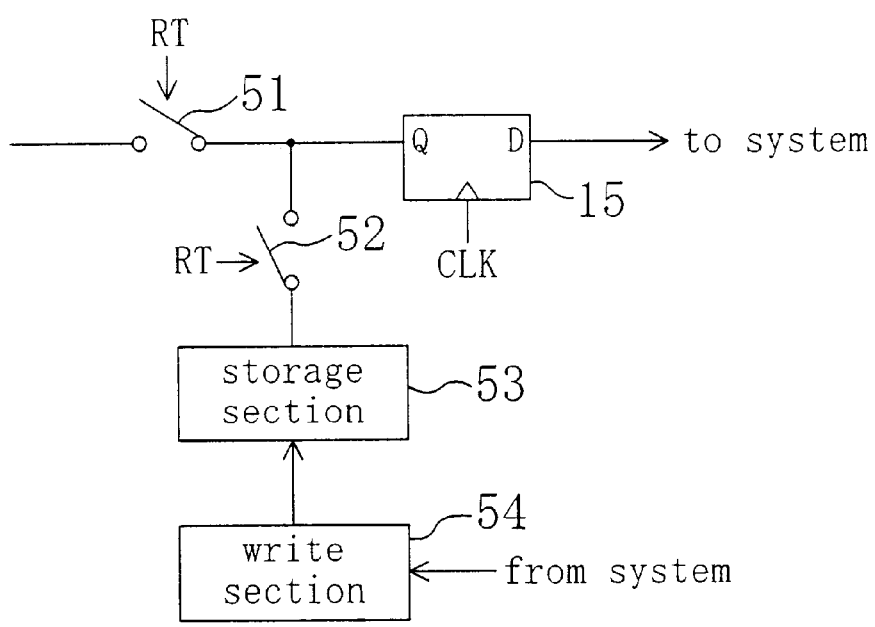
FIG. 13 illustrates another configuration for the final determination section 50 shown in FIG. 12.

Alternatively, the switches 51 and 52, storage section 53 and write section 54 may be provided to precede the flip-flop 15 as shown in FIG. 13.

Figure 14:
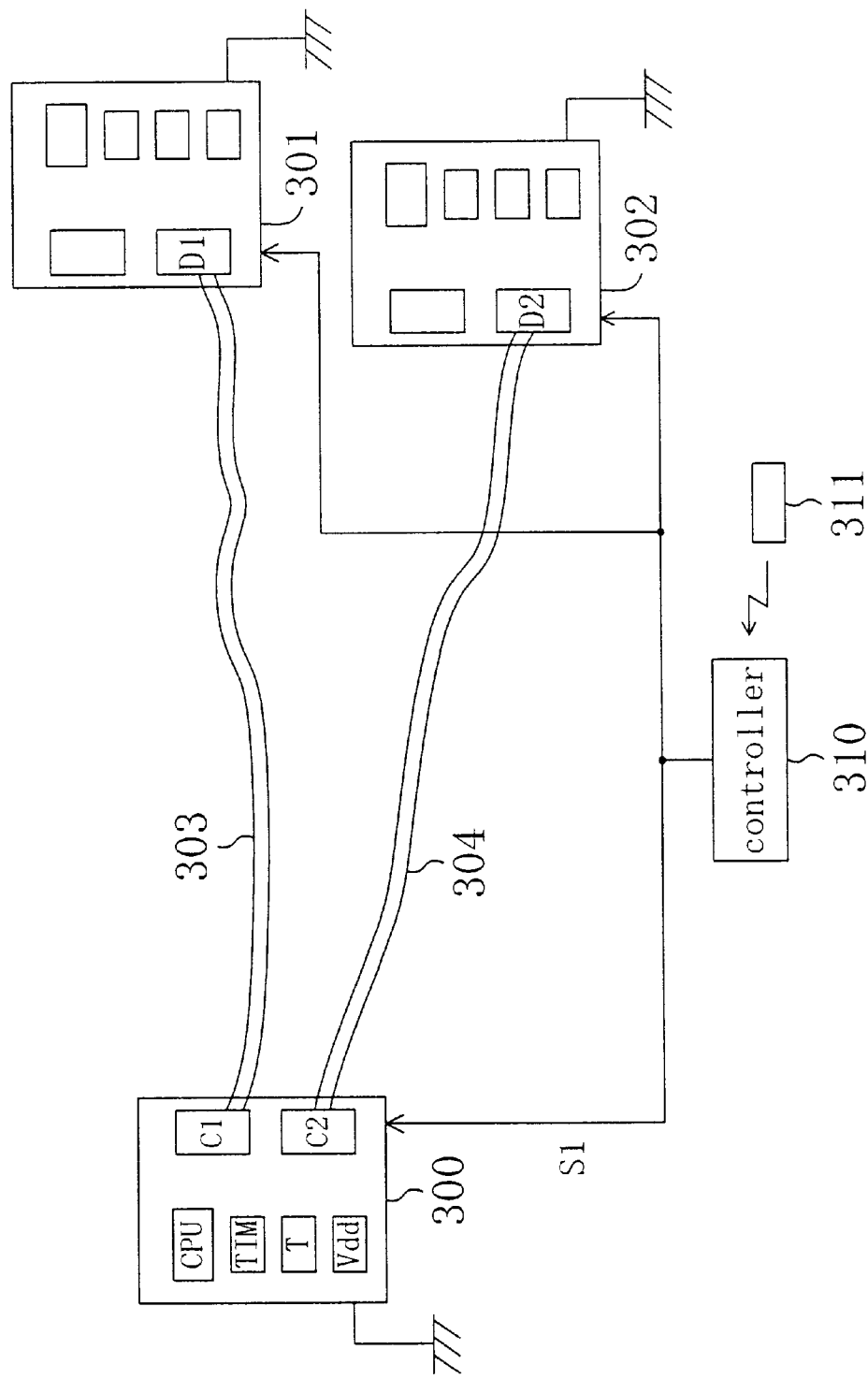
FIG. 14 illustrates an exemplary system utilizing a differential signal level determination circuit according to any of the embodiments of the present invention.

FIG. 14 illustrates an exemplary system utilizing differential signal level determination circuits according to any of the embodiments of the present invention. In the system illustrated in FIG. 14, a first differential signal level determination circuit C1 included in a first unit 300 receives a differential signal that has been transmitted from a driver D1 included in a second unit 301 through a first twisted pair cable 303. A second differential signal level determination circuit C2 also included in the first unit 300 receives a differential signal that has been transmitted from a driver D2 included in a third unit 302 through a second twisted pair cable 304.

Also, in the system illustrated in FIG. 14, all of the first, second and third units 300, 301 and 302 are controlled by a controller 310 collectively and intensively. In response to an instruction like power ON/OFF that has been received from a remote controller 311, the controller 310 outputs a control signal to the respective units 300, 301 and 302. On receiving a signal instructing power ON as the system information S1, for example, the intermediate potential monitoring section of each of the differential signal level determination circuits C1 and C2 in the first unit 300 expects a variation of the intermediate potential Vm and sends the information signal to the level-determining section thereof. Responsive to the information signal, the level-determining section performs the stabilizing operation in the above-described manner.

If these units 300, 301 and 302 are not controlled collectively and intensively but separately, then these differential signal level determination circuits C1 and C2 receive the system information S1 from a control section included in the first unit 300 and perform the stabilizing operation depending on the necessity.

Figure 15:
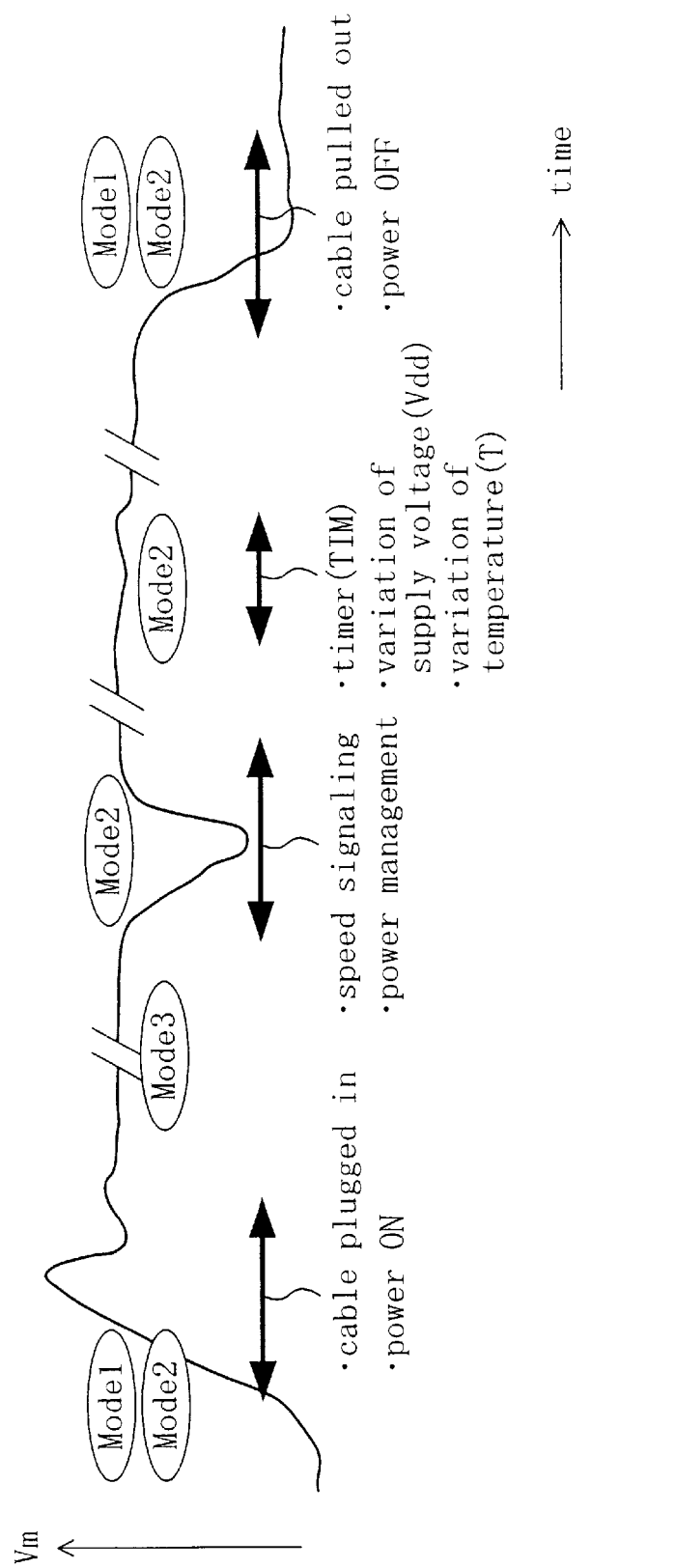
FIG. 15 illustrates how the intermediate potential changes in the system shown in FIG. 14.
Figure 16:
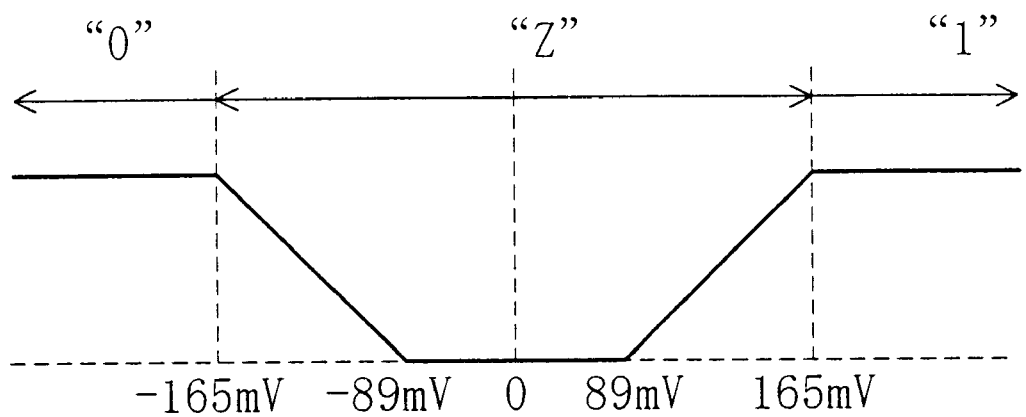
FIG. 16 illustrates tristate level determination of a differential signal according to the IEEE 1394 standard.

FIG. 15 illustrates how the intermediate potential Vm changes in the system shown in FIG. 14 and shows three modes of the system. In Mode 1, a cable is plugged in or pulled out or the power of units is turned ON or OFF. In Mode 2, the system intentionally changes a cable voltage for the purpose of speed signaling, for example. And in Mode 3, effective data is transmitted.

The system shown in FIG. 14 supports the hot swap of the twisted pair cables 303 and 304. For example, when the two units 300 and 301 are successively connected together via the cable 303 (Mode 1), the differential signal level determination circuits C1 and C2 in the unit 300 perform the stabilizing operation to cope with a steep rise of the intermediate potential Vm (Mode 2) now that the counterpart unit 301 is connected. And when the variation of the intermediate potential Vm has settled to a certain level, the data starts to be transmitted (Mode 3). If the intermediate potential monitoring section of the differential signal level determination circuit has a function of sensing the intermediate potential, then the level determination circuit performs the stabilizing operation every time the circuit senses the variation of the intermediate potential Vm in Mode 3.

As is apparent from the foregoing description, if the intermediate potential of a differential signal is expected to change, the inventive level determination circuit determines the level of the differential signal by performing a stabilizing operation, e.g., sampling or fixing the input or output of a comparator, such that the level determined is not affected by the change of the intermediate potential. Thus, it is possible to avoid an unfavorable situation where a state machine included in a system utilizing the determined level changes into an unexpected state. As a result, the system can operate stably enough.

What is claimed is:

1. A circuit for determining a level of a differential signal, the circuit comprising:

a level-determining section, which includes a comparator section receiving the differential signal as input and determines the level of the differential signal by an output of the comparator section; and an intermediate potential monitoring section for sending an information signal, which informs that an intermediate potential of the differential signal will change, to the level-determining section, wherein in response to the information signal received from the intermediate potential monitoring section, the level-determining section determines the level of the differential signal by performing a stabilizing operation such that the level determined is not affected by the change of the intermediate potential.

2. The circuit of claim 1, wherein the level-determining section performs the stabilizing operation by sampling the output of the comparator section multiple times during a level determination interval and regards a most frequently sampled value as the level of the differential signal.

3. The circuit of claim 2, wherein the level-determining section samples the output of the comparator section at a frequency higher than that of a system clock signal for a system that receives the determined level as input.

4. The circuit of claim 1, wherein the level-determining section performs the stabilizing operation by fixing an input to the comparator section or an output of the comparator section during a level determination interval irrespective of a state of the differential signal.

5. The circuit of claim 4, wherein the level-determining section further comprises:

a switch, provided on the input side of the comparator section, for selectively inputting the differential signal to the comparator section; and a storage section, provided between the comparator section and the switch, for retaining a potential difference represented by the differential signal to be input to the comparator section, and wherein during the level determination interval, the switch is turned OFF such that the differential signal is not input to the comparator section and that the potential difference retained in the storage section is input to the comparator section.

6. The circuit of claim 4, wherein the level-determining section further comprises:

a switch, provided on the output side of the comparator section, for selectively passing an output of the comparator section out of the level-determining section; and a storage section, provided on the opposite side of the comparator section with respect to the switch, for retaining the output of the comparator section that will be passed out of the level-determining section, wherein during the level determination interval, the switch is turned OFF such that the output of the comparator section is not passed out of the level-determining section and that the output of the comparator section retained in the storage section is passed out of the level-determining section.

7. The circuit of claim 1, wherein the intermediate potential monitoring section includes means for sensing the intermediate potential, and wherein when the intermediate potential is expected to change considering a result obtained by the sensing means, the monitoring section outputs the information signal.

8. The circuit of claim 1, wherein the intermediate potential monitoring section receives, as input, system information, which informs that the intermediate potential is expected to change, and wherein when the monitoring section knows from the system information that the intermediate potential is expected to change, the monitoring section outputs the information signal.

9. The circuit of claim 1, wherein the comparator section comprises:

a master comparator, which receives the differential signal as differential input and supplies a sensed current corresponding to the potential difference represented by the differential input; and means for supplying an offset current, and wherein the comparator section outputs a current representing a difference between the sensed and offset currents, and determines whether or not a potential difference represented by the differential signal has exceeded an offset voltage, and wherein the offset current supply means controls the magnitude of the offset current by the intermediate potential of the differential signal so as to stabilize the offset voltage.

10. The circuit of claim 1, wherein the comparator section comprises:

a first comparator, which receives the differential signal as differential input;

a second comparator, which receives an inverted version of the differential signal as differential input; and a level determiner, which receives outputs of the first and second comparators as respective inputs and provides "1" or "0" when the outputs match each other or "Z" when the outputs do not match.

11. A method for determining a level of a differential signal, the method comprising the steps of:

inputting the differential signal to a comparator;

determining whether or not an intermediate potential of the differential signal will change; and when the intermediate potential is expected to change, determining the level of the differential signal by an output of the comparator by performing a stabilizing operation such that the level determined is not affected by the change of the intermediate potential.

12. The method of claim 11, wherein the stabilizing operation is performed by sampling the output of the comparator multiple times during a level determination interval and a most frequently sampled value is regarded as the level of the differential signal.

13. The method of claim 11, wherein the stabilizing operation is performed by fixing an input to the comparator or an output of the comparator during a level determination interval irrespective of a state of the differential signal.

14. The method of claim 13, wherein the input to the comparator or the output of the comparator is fixed at such a value as stabilizing a state machine included in a system using the determined level of the differential signal.

15. A method for determining a level of a differential signal, the method comprising the steps of:

a) inputting the differential signal to a comparator section, the comparator section including a comparator for determining whether or not a potential difference represented by the differential signal has exceeded an offset voltage; and b) determining the level of the differential signal by an output of the comparator section, wherein the comparator section comprises:

a master comparator, which receives the differential signal as differential input and supplies a sensed current corresponding to the potential difference represented by the differential input; and means for supplying an offset current, and wherein the comparator section outputs a current representing a difference between the sensed and offset currents and wherein the offset current supply means controls the magnitude of the offset current by an intermediate potential of the differential signal so as to stabilize the offset voltage and to determine the level of the differential signal stably with respect to a static change of the intermediate potential of the differential signal, and wherein a stabilizing operation is performed in the step b) such that the level of the differential signal is determined stably even against a dynamic change of the intermediate potential of the differential signal without being affected by the change of the intermediate potential.

* * * * *